United States Patent [19]

Benson et al.

[11] Patent Number: 5,164,543
[45] Date of Patent: Nov. 17, 1992

[54] APPARATUS FOR CONNECTING AND SHIELDING ENCLOSURES HOUSING ELECTRONIC EQUIPMENT

[75] Inventors: John M. Benson, Westwood; David M. Alessandrini, Clinton; Wayne D. Rett, Milford, all of Mass.

[73] Assignee: Digital Equipment Corporation, Maynard, Mass.

[21] Appl. No.: 723,395

[22] Filed: Jun. 28, 1991

[51] Int. Cl.⁵ .......................... H05K 9/00; E06B 7/16
[52] U.S. Cl. .......................... 174/35 R; 174/35 MS; 220/614; 49/475; 49/485
[58] Field of Search .............. 220/614, 681, 308, 310, 220/357, 358, 221, 222, 224; 49/492, 493, 494, 475, 485, 498; 174/35 R, 35 GC, 35 MS; 361/424

[56] References Cited
U.S. PATENT DOCUMENTS

| | | | |
|---|---|---|---|
| 1,765,443 | 6/1930 | Peterson | 174/35 GC |
| 2,720,685 | 10/1955 | Harris | 49/493 |
| 2,783,295 | 2/1957 | Ewing | 174/35 GC |
| 3,247,312 | 4/1966 | Alessi | 174/35 GC |
| 3,277,230 | 10/1966 | Stickney et al. | 174/35 GC |
| 3,296,356 | 1/1967 | McAdams | 174/35 GC |
| 3,304,360 | 2/1967 | Hadley et al. | 174/35 GC |
| 4,525,904 | 7/1985 | Petri | 24/458 |
| 4,535,565 | 8/1985 | Erickson | 49/493 |

OTHER PUBLICATIONS

Illinois Tool Works, Inc., Fastex Catalog 1988, p. 50.

Primary Examiner—Leo P. Picard
Assistant Examiner—Bot L. Ledynh
Attorney, Agent, or Firm—Cesari and McKenna

[57] ABSTRACT

An apparatus for joining together two enclosures which both mechanically fastens the enclosures and provides shielding against electromagnetic emissions. A tubular electromagnetic shield formed as an endless loop is secured around the perimeter of an interface opening by a pulurality of shield fasteners. At least some fasteners are of a fold-over type which encircles a portion of the shield and secures it to a surface. The apparatus includes fastener/spacer assemblies for joining the enclosures such that they exert a compressive force on the shield which is disposed between them.

10 Claims, 6 Drawing Sheets

APPARATUS FOR CONNECTING AND SHIELDING ENCLOSURES HOUSING ELECTRONIC EQUIPMENT

BACKGROUND OF THE INVENTION

1. Field of the Invention

The present invention relates generally to the field of enclosures for housing electronic equipment and, more specifically, to an apparatus for mechanically connecting two such enclosures at an interface and for providing shielding to attenuate electromagnetic energy originating from within the enclosures.

2. Discussion of the Prior Art

Components of larger computer systems are typically housed in a series of separate cabinets or enclosures which stand upright on a floor. For example, the central processing unit (CPU), main memory and related input/output circuitry may be housed within one cabinet, while a disk drive or other mass storage device is housed in a separate cabinet. A primary reason for housing such components separately is that they often represent optional equipment, which may be purchased initially as part of a new computer system or subsequently to expand or enhance the system. Thus, in order to provide flexibility for configuring or reconfiguring a system to meet the requirements of a particular application, most components are housed separately so that they may be easily and quickly removed from or added to the system.

Frequently, it is necessary or desirable to join two separate enclosures together in such a way that the components housed within may be interconnected by cables or wires which provide communication paths, power, etc. To allow easy access for such interconnecting cables or wires, it is usually necessary to remove a portion of each enclosure, such as a side panel, to create an open path between the interiors of the enclosures.

One conventional device for joining two enclosures consists of a rectangular frame which is placed between and secured to the enclosures. The frame is sized to surround an opening exposed by the removal of the side panel of an enclosure and is therefore approximately the same size as the panel.

Such conventional frames present several disadvantages, however. First, because the frame is relatively large and thin, it lacks substantial structural integrity prior to installation. Consequently, storage and shipping costs are greatly increased due to the necessity of providing special packaging to protect the frame against damage and the substantial volume occupied by the frame.

Second, since the enclosure itself is often used as shielding against electromagnetic energy emanating from the enclosed circuitry, suitable shielding must be provided when a portion (side panel) of the enclosure is removed. If a rigid frame installed between two enclosures does not fit closely or does not include suitable shielding, increased emissions will escape into the ambient environment. Since maximum permissible emission levels are established by most governments, it is essential that actual emissions remain within the allowed maximum levels so that the product may be freely marketed throughout the world.

Third, each frame is sized to fit a particular size of enclosure and is generally not usable with other sizes of enclosures. Accordingly, different sizes of frames must be made and stocked if more than one size of enclosure is offered.

Finally, the frame may adversely impact the appearance of the enclosures by introducing a non-uniform "seam" between the enclosures.

SUMMARY OF THE INVENTION

In brief summary, the present invention provides an apparatus for mechanically connecting two enclosures which includes shielding to attenuate electromagnetic energy originating from within the enclosures. The apparatus is inexpensive to manufacture, is easily installed and is readily adapted to varying sizes of enclosures. Prior to installation, the component parts of the apparatus occupy a relatively small volume and are relatively invulnerable to deformation or damage during storage or shipment. In addition, the installed apparatus presents an attractive outward appearance which does not detract from that of the enclosures.

The apparatus comprises a tubular electromagnetic shield formed as an endless loop, shield fasteners for securing the shield to a surface, and fastener/spacer assemblies for joining the enclosures together. The shield is preferably sized to surround an opening in a surface of an enclosure. Small apertures disposed in the surface between the shield and the opening serve as mounting points for the shield fasteners.

One or more of the shield fasteners is preferably an improved fold-over clip. Each of these clip fasteners includes a retention head at one end which is connected by a pair of flexible cords to a second end in which an aperture is disposed. A portion of the tubular electromagnetic shield is placed transverse to the cords of the clip and the retention head is folded over approximately 180° with respect to the aperture end, thereby causing the cords to encircle the shield. The retention head is then inserted through both the aperture in the opposite end of the clip and one of the mounting apertures disposed in the surface of the enclosure. The retention head and apertures are shaped to cooperate and cause the head to become locked in the apertures once inserted, thus securing the shield to the surface of the enclosure.

A second enclosure, which includes an opening like that of the first enclosure, is positioned so that the respective openings face each other. The fastener/spacer assemblies are used to fasten the enclosures together such that they exert a compressive force on the shield between them. The fastener/spacer assemblies also maintain a predetermined clearance between the enclosures to prevent the application of excessive force to the shield.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

DETAILED DESCRIPTION OF AN ILLUSTRATIVE EMBODIMENT

Figure 1:
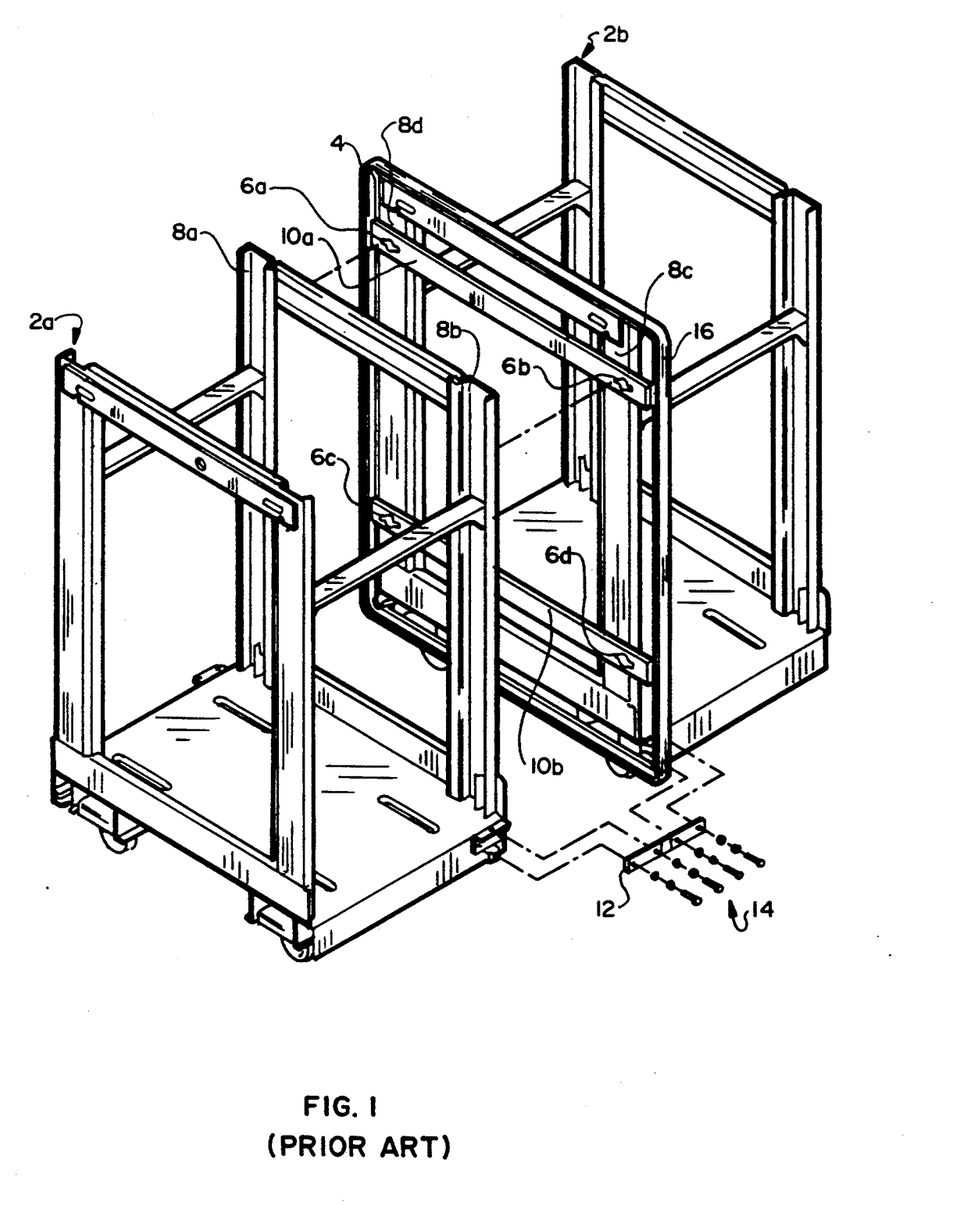
FIG. 1 is a perspective view of a device known in the prior art for connecting two enclosures together.

FIG. 1 shows two enclosure or cabinet frames 2a and 2b which are known in the prior art. The enclosure frames 2a and 2b are of a type used for enclosures which house computer system components (not shown). An expansion frame 4, also known in the prior art, is positioned between the enclosure frames 2a and 2b and is used to join two enclosures together. The expansion frame 4 includes four keyed slots 6a, 6b, 6c and 6d, which are located on two crossbars 10a and 10b. The slots 6a-6b are positioned and shaped to engage corresponding projections (not visible) on vertical supports 8a and 8b. The bases of the enclusure frames 2a and 2b are fastened together by a strap 12 and four fasteners 14. A second strap and four fasteners, all of which are omitted for clarity, are used to secure the rear corners of the enclosure frames 2.

Due to its size and the fact that it is typically made of thin metal, the expansion frame 4 is not particularly stiff prior to installation and is therefore vulnerable to damage during storage or shipping in the absence of large and costly protective packaging. Installation is complicated because the expansion frame 4 must first be attached to one of the enclosure frames 2a and 2b and then maneuvered into position so that the keyed slots may correctly engage their respective projections. In addition, the frame 4 does not include any electromagnetic shielding, which increases the likelihood that excessive electromagnetic emissions will escape from the gaps between the frame and enclosures.

Figures 2, 2A, 2B, 2C:
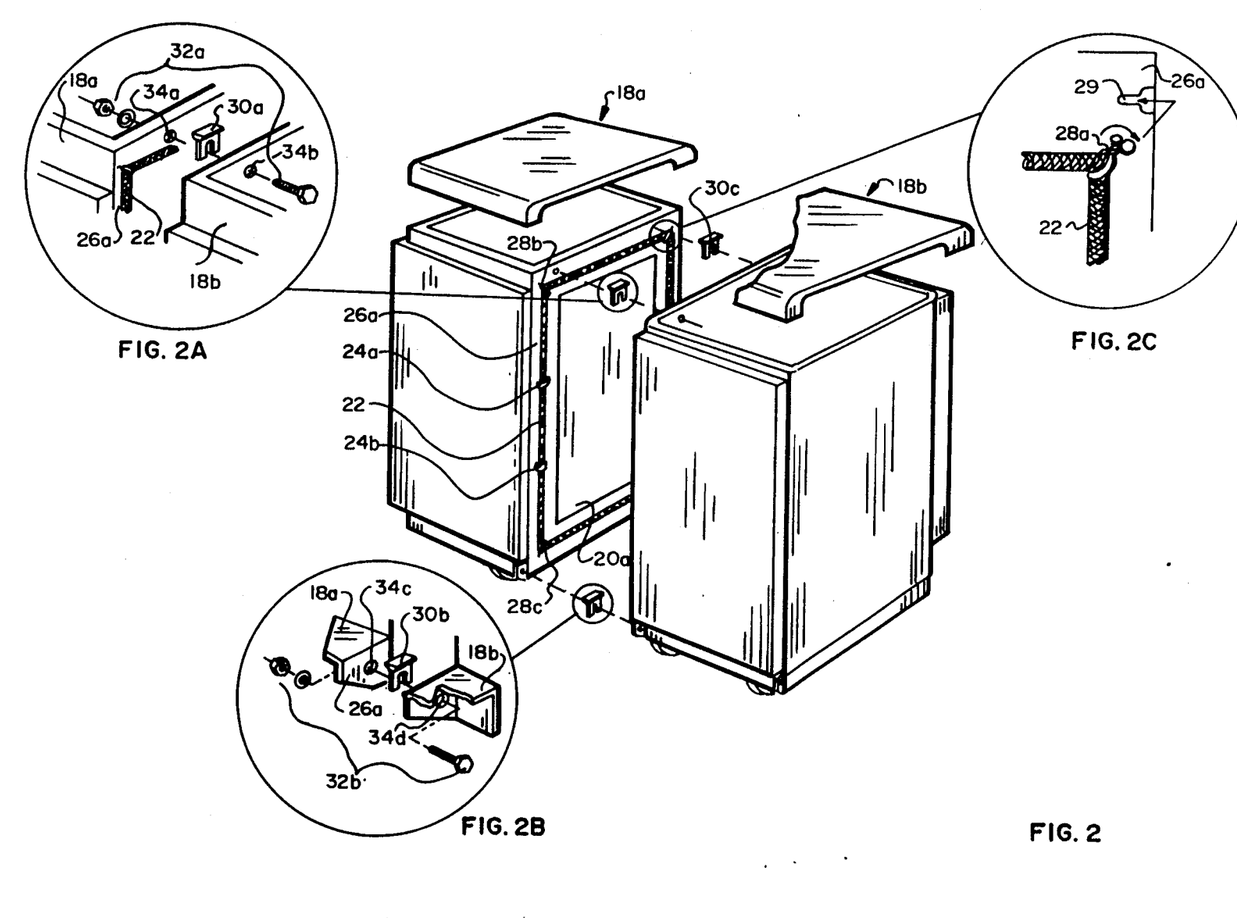
FIG. 2 is a perspective view of an apparatus for connecting two enclosures which is constructed in accordance with a preferred embodiment of the present invention.
FIGS. 2A and 2B are enlarged views of the fastener/spacer assemblies of FIG. 2.
FIG. 2C is an enlarged view of one type of shield fastener used to secure the electromagnetic shield of FIG. 2.

FIG. 2 shows two enclosures and an apparatus for joining them together, which apparatus is constructed in accordance with the present invention. Two enclosures 18a and 18b, which are to be joined together at one side, each have one side panel removed. An interface opening 20a in enclosure 18a faces a similar interface opening (not visible) in enclosure 18b.

An electromagnetic shield 22, which is formed as an endless loop, surrounds the opening 20a. The shield 22 is preferably made from a flexible, hollow silicon tube approximately 0.39" (10 mm) in diameter having two layers of Ferex metallic mesh embedded within it. Such tubular shield material may advantageously be cut to any desired length which, in combination with its flexibility, allows the formation of a shield of practically any shape or size required for different enclosures or interface openings. Moreover, due to its flexibility, the shield 22 may be coiled or folded, without damage, in a small volume for storage or shipping.

The shield 22 is fastened to a surface 26a by a number of shield fasteners 24a, 24b and 28a-28c. Fasteners 28 are preferably used to secure the shield 22 at its corners, whereas one or more fold-over clip fasteners 24a and 24b are preferably used to secure the shield 22 at intervals between the corners.

As shown best in FIG. 2C, each fastener 28a-28c preferably a commercially available purse lock tie, one such tie being marketed by Fastex. Each purse lock tie consists of a horseshoe-shaped loop whose free ends are fitted with beads. A portion of the shield 22 is placed in the open loop, the ends are twisted together to close the loop, and the beads are inserted into a keyed slot 29 which is disposed in a surface 26a. The slot 29 is tapered and the tension exerted by the shield 22 on the fastener 28a tends to retain the beads in the narrower portion of the slot 29.

The clip fasteners 24a and 24b are described in detail below in connection with FIGS. 3A-3C, The enclosures 18a and 18b are fastened together by four fastener/spacer assemblies. As seen best in FIGS. 2A and 2B, each fastener/spacer assembly includes a spacer 30a, 30b or 30c and a fastener 32a or 32b, which is preferably a conventional bolt, washer and nut combination. Apertures 34a, 34b, 34c and 34d are dimensioned to receive the fasteners 32a and 32b.

Each spacer 30a-30c is preferably a molded member having a T-shaped cross-section and a notch in its lower portion. The notch allows the spacer 30a-30c to rest on the shaft of its associated bolt, which tends to maintain the spacer in the correct orientation until the fasteners are tightened. The spacers 30a-30c particularly 30a and 30c which are disposed in close proximity to the top of the shield 22, are preferably located so that they do not contact or overlap the shield, which might impair the shield's ability to attenuate electromagnetic energy.

The dimensions of the spacers 30a-30c are preferably chosen such that when the fasteners 32 are tightened, the enclosures 18 draw together and exert a compressive force upon the shield 22. This compressive force tends to ensure a smooth, gap-free seal around the perimeter of the opening 20a, thus reducing the likelihood of excessive electromagnetic emissions into the ambient environment. The spacers 30a-30c, by virtue of their selected thicknesses, maintain a predetermined clearance between the enclosures 18a and 18b so as to prevent excessive compression of the shield 22. Further, by providing a uniform predetermined clearance between enclosures, only one size (thickness) of shield material is needed to make shields of varying sizes or shapes.

Figure 3A:
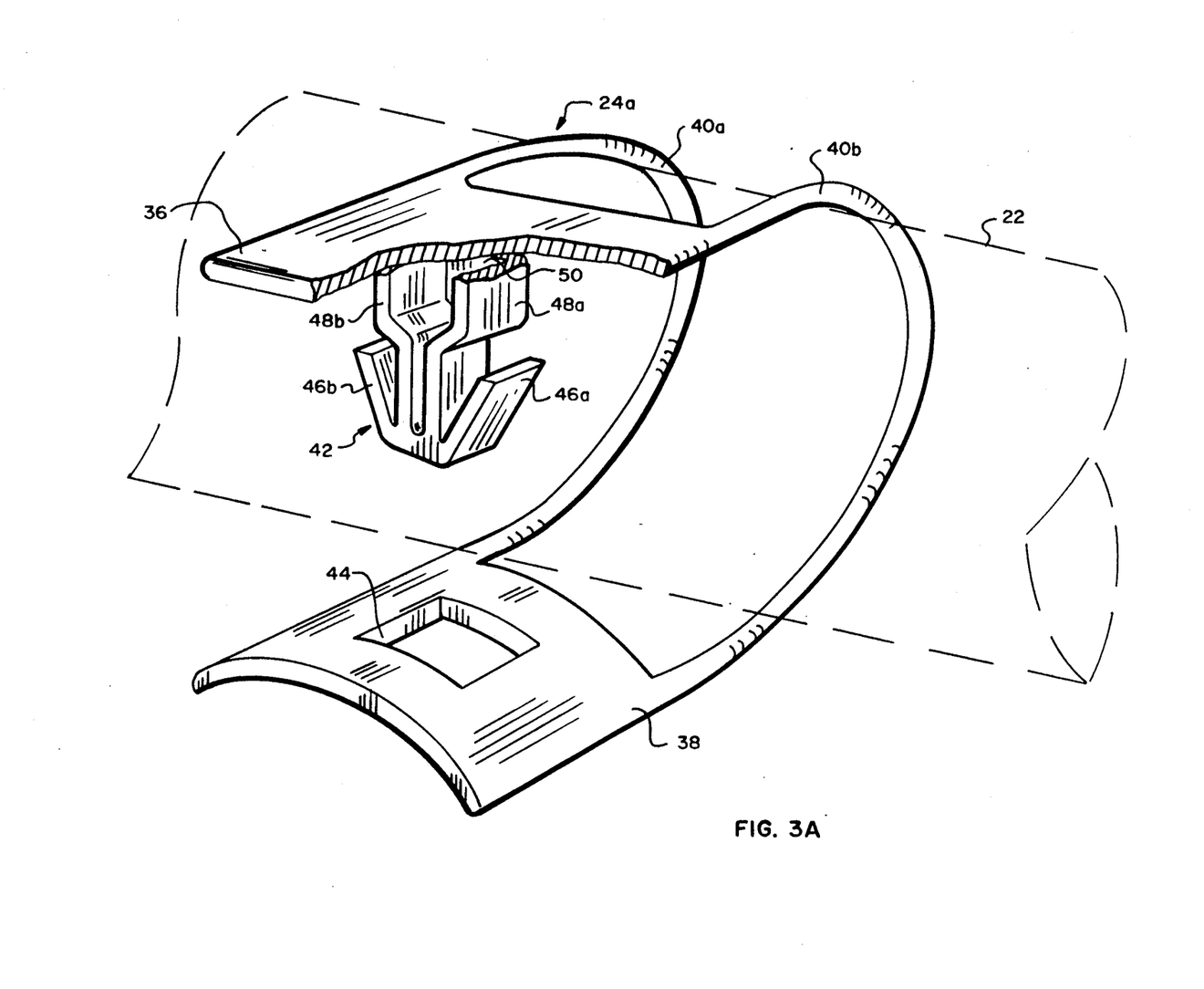
FIG. 3A is an enlarged perspective view of a fold-over clip fastener for securing an electromagnetic shield to a surface, which clip is constructed in accordance with a preferred embodiment of the present invention.
Figure 3B:
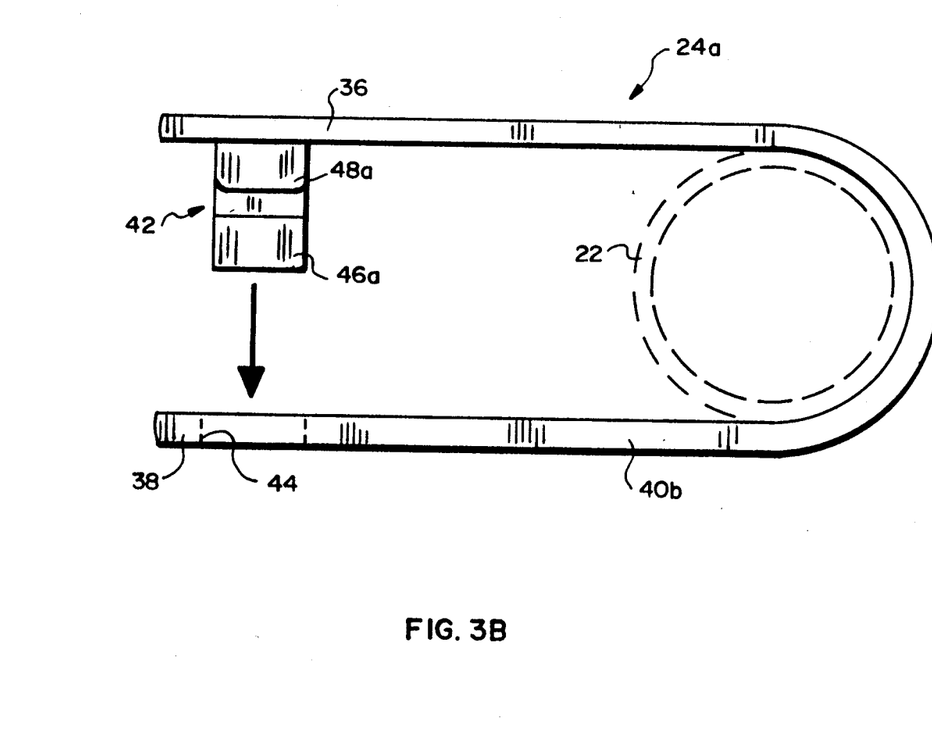
FIG. 3B is a side view of the clip shown in FIG. 3A.
Figure 3C:
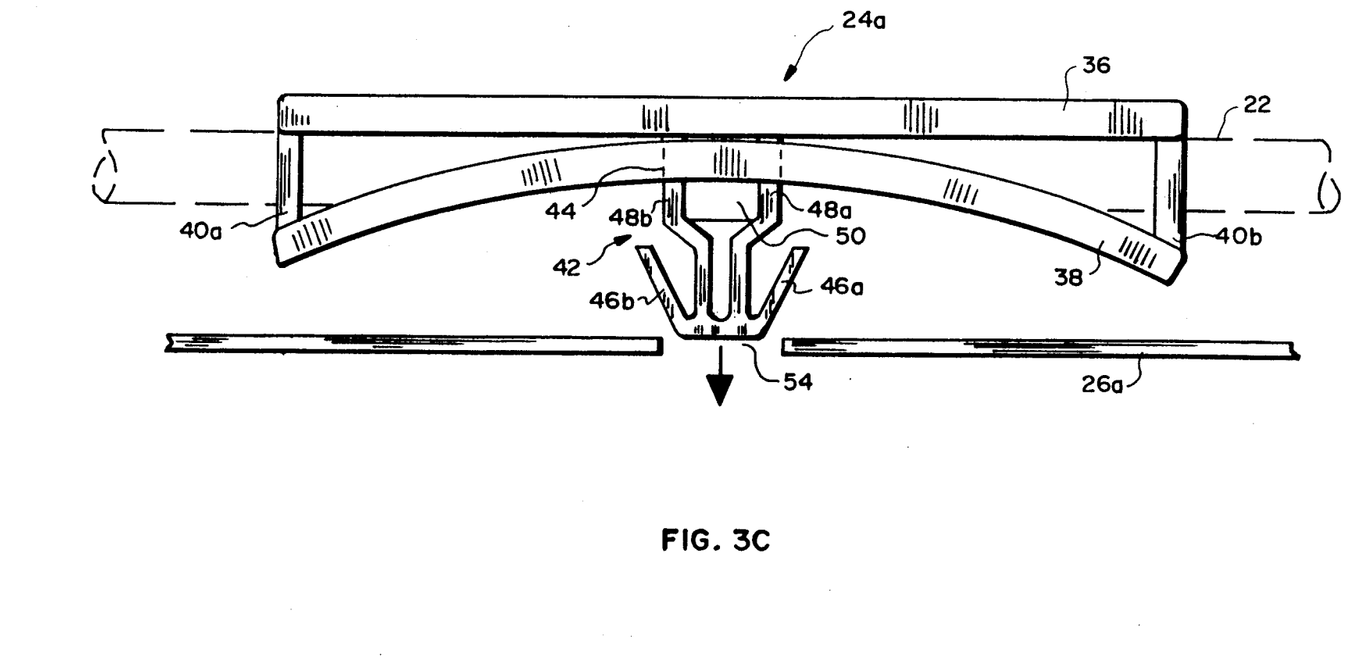
FIG. 3C is a front view of the clip shown in FIG. 3A after the clip has been closed.

FIGS. 3A, 3B and 3C show in enlarged detail one of the fold-over clip shield fasteners 24a of FIG. 2. One end 36 of the shield fastener 24a is preferably integrally connected by two flexible cords 40a and 40b to a second end 38. The cords 40a and 40b are sufficiently long that they substantially encircle a portion of the shield 22 (which is oriented transverse to the cords) when the end 36 is folded over or bent approximately 180° with respect to the end 38. In addition, the cords 40a and 40b are preferably of relatively small thickness or cross-section, as compared to the thickness of the shield 22. An advantage of such cords is that they do not cover a substantial amount of the shield or create significant breaks in the plane of the shield, which would allow excessive electromagnetic energy to pass through into the ambient environment.

The end 38 is preferably slightly arcuate in cross-section, referring to a section taken parallel to the shield 22, so that the fastener 24a may be secured to surfaces of varying thickness as described below.

A retention head 42 is preferably integrally attached to the end 36. The head 42 includes two offsets 48a and 48b which are integrally connected with end 36 and two flexible stop members 46a and 46b, respectively. Each of the stop members 46a and 46b is oriented at an angle such that the free end of the head 42 is narrower than its middle. An integral brace 50 both connects and stiffens the offsets 48a and 48b.

The head 42 is of the insertable-locking type and is shaped to mate with an aperture 44 in the end 38. As the head 42 is thrust into the aperture 44, the flexible stop members 46 are compressed and "swept back" against the offsets 48. Once the stop members 46a and 46b clear the edge of the aperture 44, they resiliently return to their original positions, as shown best in FIG. 3C. Since the distance between the free ends of the stop members 46a and 46b is greater than the width of the aperture 44, the retention head 42 is prevented from retracting through the aperture once inserted and the fastener 24a is thus effectively locked in a closed position around a portion of the shield 22.

The fastener 24a is preferably made from nylon which is sufficiently strong and suitably flexible.

As shown in FIGS. 2 and 3C, the closed fastener 24a is secured to the surface 26a by inserting the retention head 42 into a mounting aperture 54 disposed in that surface. The mounting aperture 54 is preferably located between the shield 22 and the opening 20a so that electromagnetic energy which may pass through the aperture 54 is subject to attenuation by the shield. Further, both the mounting aperture 54 and aperture 44 are preferably square so that, in cooperation with the retention head 42, they may prevent the head 42 from rotating within those apertures. By inhibiting such rotation, the likelihood that the shield 22 will become skewed or misaligned on the surface 26a is greatly reduced, which in turn reduces the likelihood that small gaps where emissions could escape may exist between the shield and the enclosures.

When the head 42 is inserted into the mounting aperture 54, the stop members 46a and 46b operate in a manner similar to that described above. As a result, the head 42 becomes locked within the mounting aperture 54, thus effectively fastening the shield 22 to the surface 26a.

The arcuate cross-section of the end 38 of the fastener 24a advantageously provides increased vertical clearance, as compared to a flat cross-section, between the bottom surface of end 38 and stop members 46. Consequently, when the head 42 is inserted into mounting apertures of different depths (i.e., surfaces of different thicknesses), the stop members 46a and 46b may nonetheless completely clear the edge of the mounting aperture and securely lock the head 42 in place. Thus, a single size of fastener 24a may be applied to a variety of surfaces of varying thicknesses.

Figure 4:
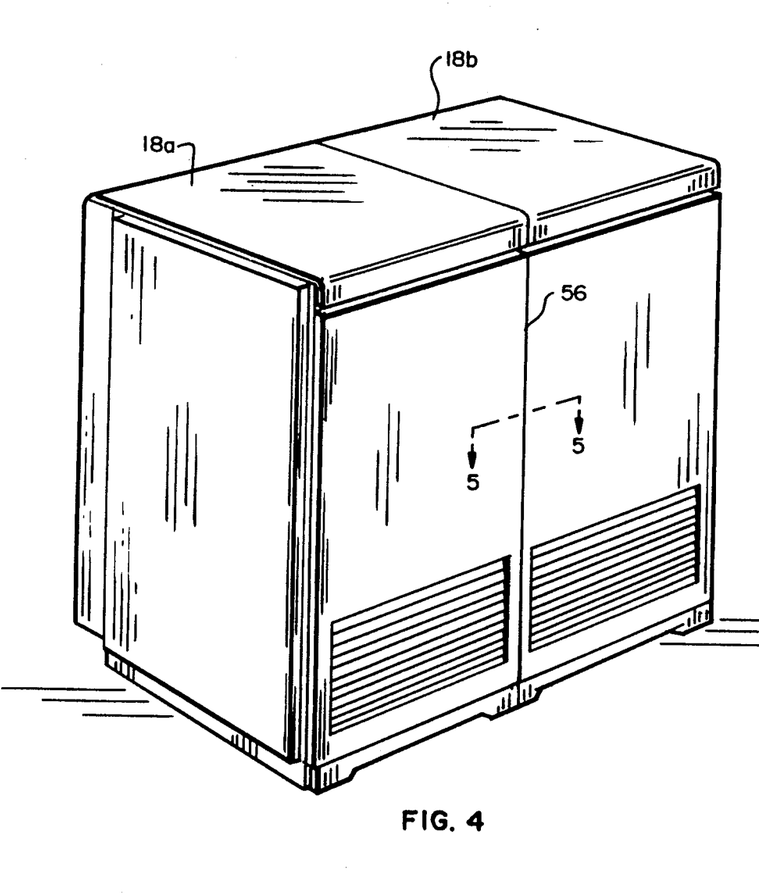
FIG. 4 is a perspective view of two enclosures joined together using the apparatus of FIG. 2.
Figure 5:
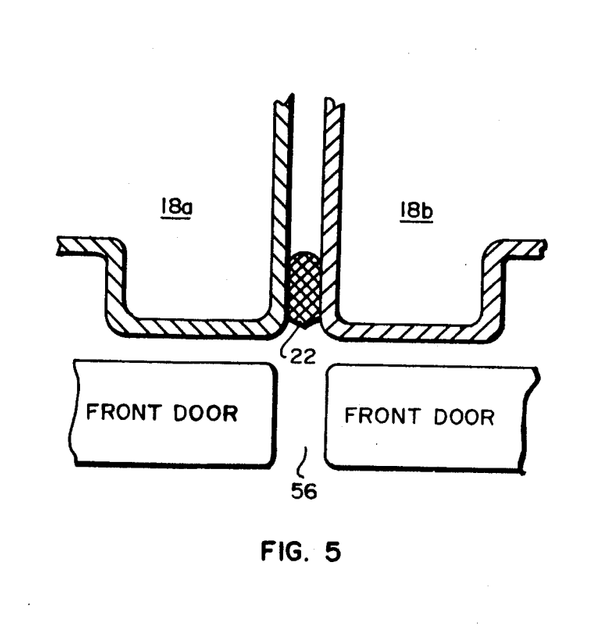
FIG. 5 is a section taken along line 5—5 of FIG. 4.

FIG. 4 shows the enclosures 18a and 18b of FIG. 2 joined together. The enclosures 18a and 18b meet an interface 56 which presents an outward appearance of a clean, narrow line that looks consistent and uniform with other vertical lines and edges of the enclosures. As shown in FIG. 5, which a section taken along line 5—5 of FIG. 4, the shield 22 is slightly compressed between the enclosures 18a and 18b which provides a snug, continuous seal around the interface 56. The width of the interface 56 may be varied by modifying the dimensions of the spacers 30a–30c (FIGS. 2A and 2B), which may be necessary or desirable to provide necessary clearance for doors or the like.

The foregoing description has been limited to a specific embodiment of this invention. It will be apparent, however, that variations and modifications may be made to the invention, with the attainment of some or all of the advantages of the invention. Therefore, it is the object of the appended claims to cover all such variations and modifications as come within the true spirit and scope of the invention.

What is claimed as new and desired to be secured by Letters Patent of the United States is:

1. An apparatus for mechanically joining two enclosures and providing shielding against electromagnetic emissions originating from within said enclosures, said apparatus comprising:

electromagnetic shield means, shaped to substantially surround an interface opening in a first enclosure, for attenuating electromagnetic energy emanating from within said enclosures;

a plurality of shield connector means for securing said shield means around said interface opening; and a plurality of fastening means adapted to mechanically secure the first enclosure to a second enclosure such that said shield means is compressed between the enclosures, at least one of said plurality of fastening means including spacer means for providing a predetermined clearance between the secured first and second enclosures, whereby said enclosures are prevented from exerting an excessive compressive force on the shield means.

2. The apparatus as in claim 1 wherein said shield means is an endless loop formed from a tubular material.

3. The apparatus as in claim 1 wherein at least one of said plurality of shield connector means comprises a fold-over clip, said clip having first and second ends connected together by one or more flexible members, said first end including a head means shaped to pass through an aperture in one direction and to remain locked therein, said second end including an aperture shaped to receive said head means, said flexible members being sufficiently long that when a portion of said shield means is placed transverse to said members and said first end is bent approximately 180° with respect to said second end, said members substantially encircle said shield means portion.

4. The apparatus as in claim 3 wherein said clip is secured to a surface by first inserting said head means through said second end aperture and then through a mounting aperture disposed in said surface between said shield and said interface opening, whereby electromagnetic emissions passing through said mounting aperture are subject to attenuation by said shield.

5. The apparatus as in claim 4 wherein said head means and said apertures are shaped to prevent said head means from rotating within said apertures, thereby preventing misalignment of said shield.

6. The apparatus as in claim 3 wherein said second end has an arcuate cross-section, whereby said clip may be secured to surfaces of varying thicknesses.

7. The apparatus as in claim 3 wherein said flexible members comprise two spaced apart cords which integrally connect said first and second ends.

8. The apparatus as in claim 7 wherein each of said cords has a thickness which is substantially smaller than the thickness of said shield means, whereby when said cords encircle said shield portion they do not substantially interfere with the ability of said shield means to attenuate electromagnetic energy.

9. The apparatus as in claim 1 wherein at least one of said spacer means comprises a member having a T-shaped cross-section and a notch for receiving a fastener.

10. The apparatus as in claim 1 wherein at least one of said plurality of shield connector means comprises a purse lock tie which encircles a portion of the shield means, said tie having beaded ends which are secured in a tapered aperture disposed in said surface.

* * * * *